(12) United States Patent
Junkins et al.

(10) Patent No.: US 7,535,730 B2
(45) Date of Patent: May 19, 2009

(54) METHOD OF ACCESSING A MOTHERBOARD TO WHICH A DAUGHTER CARD IS CONNECTED

(75) Inventors: Andrew T. Junkins, Round Rock, TX (US); Brently L. Cooper, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 96 days.

(21) Appl. No.: 10/974,263

(22) Filed: Oct. 27, 2004

(65) Prior Publication Data

US 2005/0059286 A1  Mar. 17, 2005

Related U.S. Application Data

(62) Division of application No. 10/355,436, filed on Jan. 31, 2003, now Pat. No. 6,816,388.

(51) Int. Cl.
*H05K 7/14* (2006.01)
(52) U.S. Cl. .................. 361/801; 361/802; 361/727; 439/377; 29/832
(58) Field of Classification Search ........... 29/832–835, 29/729, 739; 361/786, 724, 752, 754, 798, 361/736; 439/136, 74; 211/41.17
See application file for complete search history.

(56) References Cited

U.S. PATENT DOCUMENTS

| | | | | |
|---|---|---|---|---|
| 4,197,572 A * | 4/1980 | Aimar | ...................... | 361/755 |
| 5,594,627 A * | 1/1997 | Le | ........................ | 361/801 |
| 5,634,803 A * | 6/1997 | Cheng et al. | ................ | 439/157 |
| 5,761,030 A | 6/1998 | Roscoe | ....................... | 361/684 |
| 5,769,668 A * | 6/1998 | Tondreault | .................. | 439/633 |
| 5,775,925 A * | 7/1998 | Tondreault | .................. | 439/157 |
| 5,967,633 A | 10/1999 | Jung | ....................... | 312/223.2 |
| 6,007,357 A * | 12/1999 | Perino et al. | ................ | 439/327 |
| 6,097,591 A * | 8/2000 | Ircha | ......................... | 361/683 |
| 6,169,662 B1 * | 1/2001 | Clark et al. | .................. | 361/754 |
| 6,183,284 B1 | 2/2001 | Gill et al. | ..................... | 439/327 |
| 6,185,093 B1 * | 2/2001 | Moss | ......................... | 361/684 |
| 6,252,514 B1 | 6/2001 | Nolan et al. | ............. | 340/686.4 |
| 6,276,950 B1 * | 8/2001 | Yodogawa | .................. | 439/160 |
| 6,325,636 B1 | 12/2001 | Hipp et al. | ..................... | 439/61 |
| 6,381,149 B1 * | 4/2002 | Megason et al. | ............ | 361/801 |
| 6,385,040 B2 * | 5/2002 | Nabetani et al. | ............ | 361/684 |
| 6,411,506 B1 | 6/2002 | Hipp et al. | .................. | 361/686 |
| 6,430,644 B1 * | 8/2002 | Luen et al. | ................... | 710/300 |

(Continued)

*Primary Examiner*—Minh Trinh
(74) *Attorney, Agent, or Firm*—Baker Botts L.L.P.

(57) ABSTRACT

A method of accessing a motherboard in a computer system includes, during sliding of a card along a guide slot in the system, automatically interacting a first detent formed along an edge of the card with a guide tab when the card reaches an intermediate position to support the card in the intermediate position detached from the motherboard. The detachment of the card and the motherboard is sufficient to permit access to the motherboard while the card remains coupled to a system chassis. Interacting the guide tab with the detent may include extending a portion of the guide tab into the detent to provide lateral support for the card. The guide tab may be a metallic leaf spring and may be affixed to the chassis and may provide an electrical contact to a ground contact in a second detent to ground the daughter card when its attached to the motherboard.

10 Claims, 6 Drawing Sheets

U.S. PATENT DOCUMENTS

| | | | |
|---|---|---|---|
| 6,461,169 B1 * | 10/2002 | Harrison et al. | 439/65 |
| 6,480,391 B1 * | 11/2002 | Monson et al. | 361/752 |
| 6,498,731 B1 * | 12/2002 | Roscoe et al. | 361/796 |
| 6,522,554 B1 * | 2/2003 | Gomez et al. | 361/756 |
| 6,816,388 B2 * | 11/2004 | Junkins et al. | 361/801 |
| 6,967,847 B2 * | 11/2005 | Barsun et al. | 361/727 |
| 7,210,586 B2 * | 5/2007 | Ice | 211/26 |

* cited by examiner

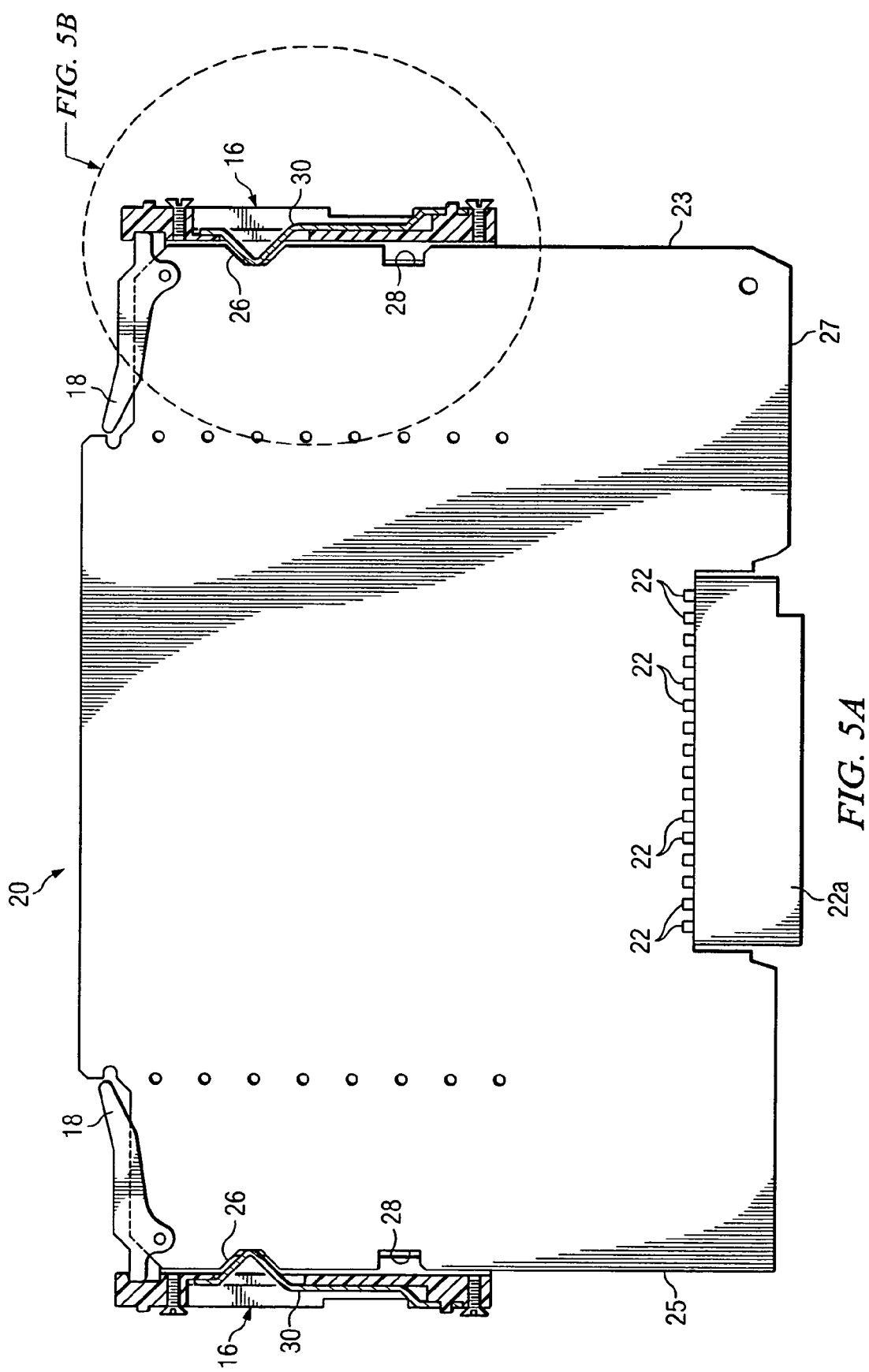

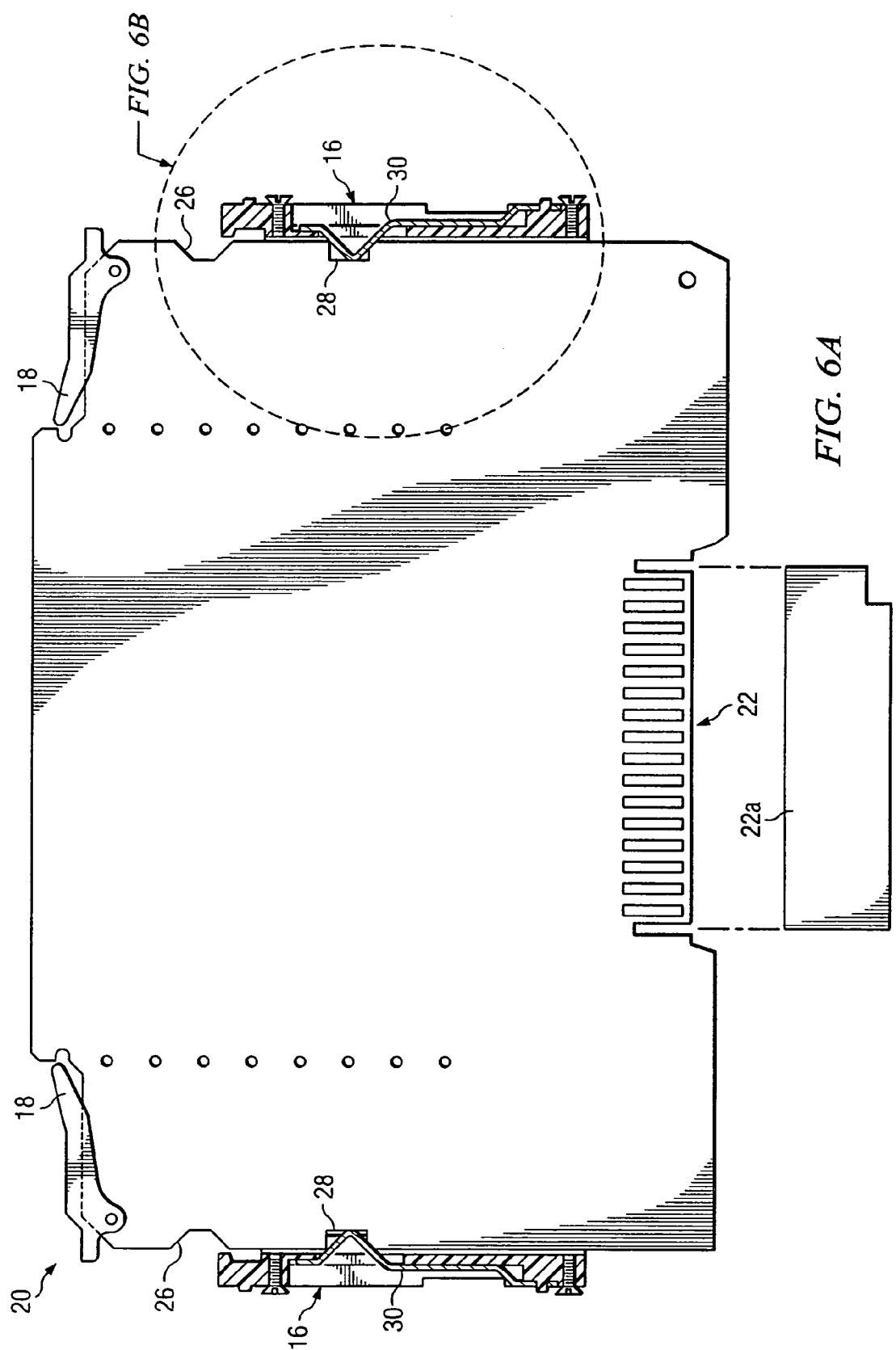

METHOD OF ACCESSING A MOTHERBOARD TO WHICH A DAUGHTER CARD IS CONNECTED

CROSS REFERENCE TO RELATED APPLICATIONS

This application is a divisional application from U.S. patent application Ser. No. 10/355,436, filed on Jan. 31, 2003 by Andrew T. Junkins et al., and entitled "Daughter Card Service Position", now U.S. Pat. No. 6,816,388.

TECHNICAL FIELD

This disclosure relates in general to the field of computers, and more particularly to a daughter card service position.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use, such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically require maintenance and servicing. For example, a system administrator may desire to replace a motherboard on the information handling system due to a system upgrade or a faulty component. Current designs of information handling systems, however, require the administrator to remove several wires and cables. As such, manufacturers strive to make improvements to information handling systems. One improvement includes a modular design that reduces or eliminates the internal wires or cables within the information handling system such as a modular based computer system.

The modular based computer system uses modular components, such as daughter cards, that couple directly to each other via connectors. Typically, the daughter cards are placed along guide tracks, which allow the connector on the daughter cards to align with another component to connect and disconnect the daughter cards. For example, a modular based computer system may include a motherboard that has several slots. Each slot is able to receive a connector from a daughter card by moving the daughter card along a guide track to connect to the motherboard. By using modular components with connectors, the information handling system may reduce the amount of internal wiring within the system.

In most modular based computer systems, a system administrator removes all the daughter cards connected to the motherboard in order to perform maintenance on the information handling system. Typically, the cards are lifted out of the system and set aside to allow the motherboard to be removed without the danger of the cards moving back into a connected position with the motherboard. If care is not taken with the removed daughter cards, the daughter cards may be subject to damage or loss. For example, a daughter card may accidentally fall from a counter top and become damaged.

In addition to damage to the daughter card from outside of the information handling system, the daughter cards may be subject to further damage due to electrical shock from inadequate electrical grounding. Because each card is built as a modular component, each card may develop static electricity. In some instances, the static electricity may affect the operation of the card due to improper grounding.

SUMMARY

Thus, a need has arisen for a daughter card with a service position.

A further need has arisen for a daughter card to include a grounding device while connected to a motherboard.

In accordance with the teachings of the present invention, the disadvantages and problems associated with a daughter card have been substantially reduced or eliminated. In some embodiments of the present invention an information handling system includes a chassis and a printed circuit board placed in the chassis. The chassis includes a guide slot formed in the chassis. The guide slot includes at least two opposing channels aligned adjacent the printed circuit board and a guide tab formed in one of the opposing channels. A card electrically couples to the printed circuit board when placed in an attached position. The card includes a first edge and a second edge that slides between the opposing channels of the guide slot such that the card aligns to couple to the printed circuit board. The card also includes a first detent formed in either the first edge or the second edge. The first detent releaseably interacts with the guide tab formed in the opposing channels such that the guide tab contacts the first detent when the card is placed in an intermediate position.

In other embodiments, a card for coupling to a printed circuit board includes a first edge and a second edge forming opposite outer boundaries of the card, a connector, and a detent. The first edge and the second edge interact with a guide slot such that the card slides in the guide slot along the first edge and the second edge. The connector may be formed on a third edge of the card to communicatively couple the card to the printed circuit board when the card is placed in an attached position. The detent is formed along either the first edge or the second edge to engage with the guide slot to support the card in an intermediate position.

In further embodiments, a method of removing a printed circuit board from a computer system includes moving a card from an attached position to an intermediate position by sliding the card along a guide slot in the computer system such that a connector on the card uncouples from the printed circuit board. The method automatically causes a guide tab to interact with a detent formed along an edge of the card when the card reaches the intermediate position such that the card is maintained apart from the printed circuit board. The method allows for removal of the printed circuit board from the computer system.

The present disclosure contains a number of important technical advantages. One technical advantage is providing a system or method that maintains a daughter card in an intermediate position or a service position. When the card is moved from an attached position to an intermediate position, a detent on the card interacts with a guide tab on the guide slots to maintain the card at the intermediate position. In some embodiments, the guide tab is designed to extend into the detent to prevent the card from sliding along the guide slots. The intermediate position allows for the printed circuit board such as a motherboard to be removed from the computer system.

Another technical advantage is providing an electrical ground for the card while attached to the printed circuit board. Providing a grounding pad on the card allows for the guide tab to contact the grounding pad when the card is placed in the attached position. In some embodiments, the guide tab may be electrically coupled to the chassis of the computer system. Thus, when the card is placed in the attached position, the guide tab may contact the grounding pad to provide a ground for the card.

All, some, or none of these technical advantages may be present in various embodiments of the present invention. Other technical advantages will be apparent to one skilled in the art from the following figures, descriptions, and claims.

BRIEF DESCRIPTION OF THE DRAWINGS

A more complete understanding of the embodiments of the present disclosure and advantages thereof may be acquired by referring to the following description taken in conjunction with the accompanying drawings, in which like reference numbers indicate like features, and wherein:

FIGS. 5A and 5B illustrate a rear view of a daughter card inserted between guide slots in an attached position according to an example embodiment of the present disclosure; and FIGS. 6A and 6B illustrate a rear view of a daughter card inserted between guide slots at a service position according to an example embodiment of the present disclosure.

DETAILED DESCRIPTION

Preferred embodiments of the present disclosure and their advantages are best understood by reference to FIGS. 1 through 6B, where like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices, as well as various input and output (I/O) devices, such as a keyboard, a mouse, and a video display. The information handling system may also include one or more buses operable to transmit communications between the various hardware components.

Figure 1:
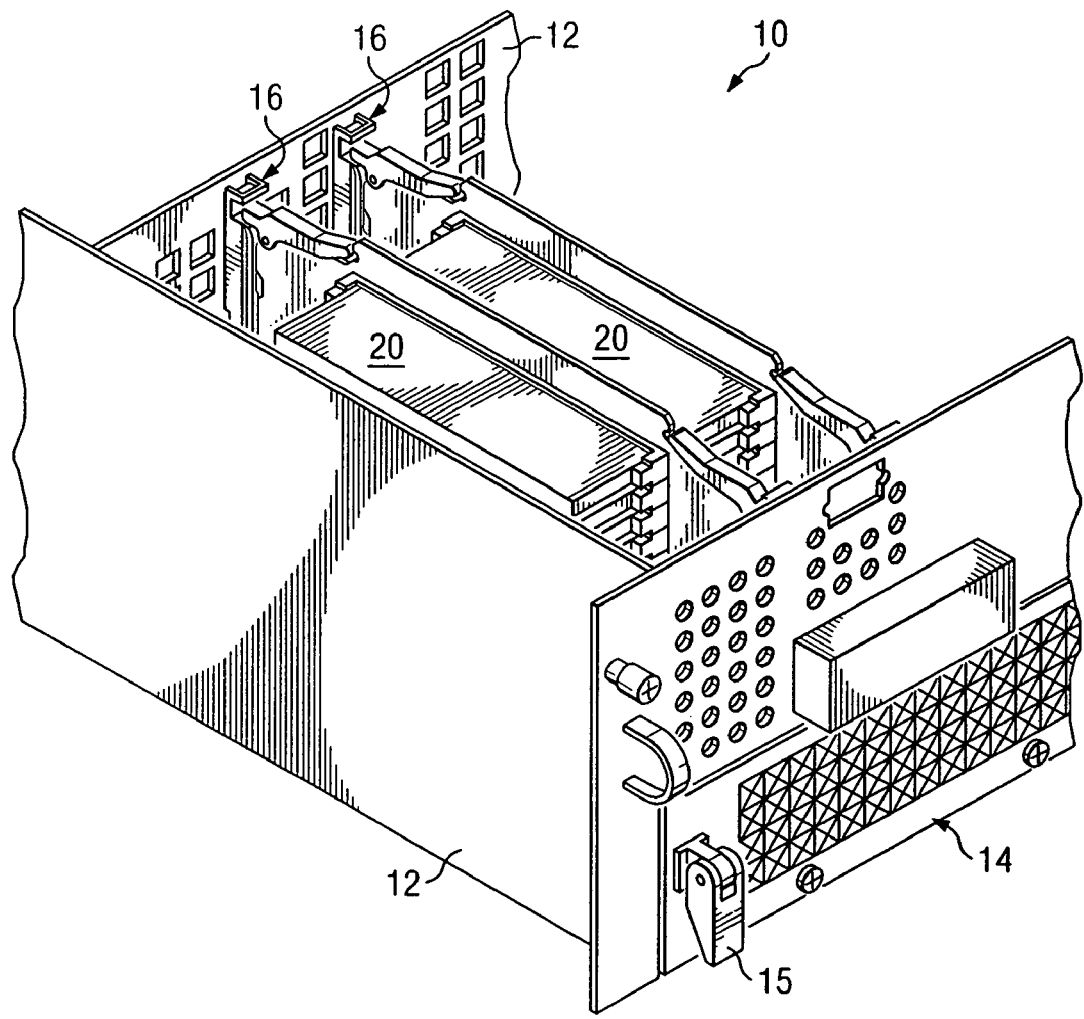
FIG. 1 illustrates a perspective view of a portion of a computer system having modular computer components according an example embodiment of the present disclosure.

FIG. 1 illustrates a perspective view of a portion of computer system 10 having modular computer components. Computer system 10 may be a type of information handling system including a rack mounted computer system such as a server. Typically, computer system 10 includes motherboard 14 that has modular components such as daughter card 20 connected to motherboard 14 via connectors 22 (as shown below in more detail). Computer system 10 may include guide slots 16 that may form a part of computer system 10 or may be coupled to chassis 12.

Chassis 12 may include the structural frame of computer system 10. However, in some instances, chassis 12 may further include the housing or case of computer system 10. In some embodiments, chassis 12 provides an electrical ground for computer system 10.

Motherboard 14 may be a printed circuit board with receiving slot 22a (shown below in more detail) that mate with connector 22 on daughter cards 20. Computer system 10 uses guide slot 16 to align daughter card 20 to motherboard 14. Motherboard 14 may also include handle 15 that allows a user to remove motherboard 14 from computer system 10. In some embodiments, daughter cards 20 are lifted out of receiving slot 22a to allow motherboard 14 to be removed from computer system 10.

Figure 2:
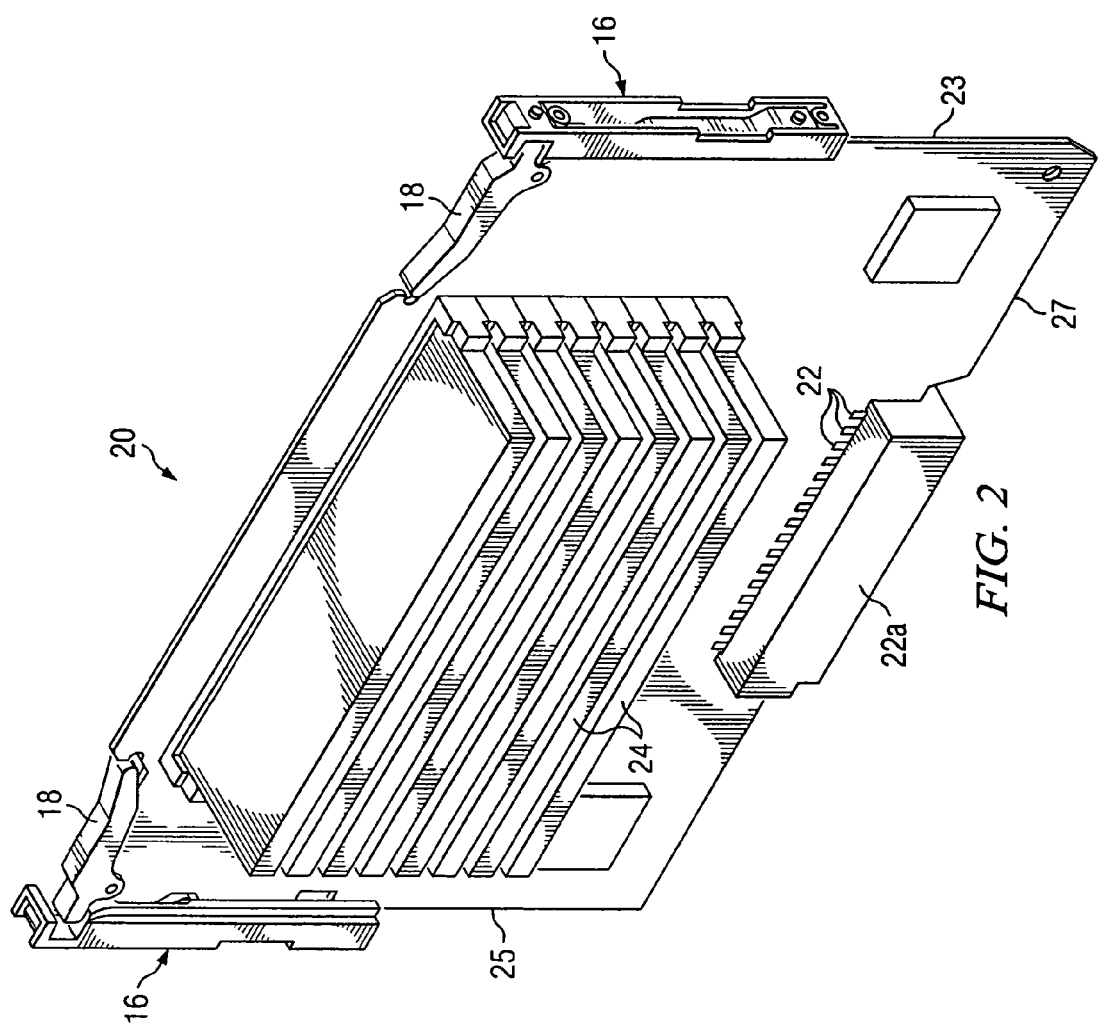
FIG. 2 illustrates a perspective view of a daughter card inserted into guide slots according to the present disclosure.

FIG. 2 illustrates a perspective view of daughter card 20 inserted into guide slots 16. Daughter card 20 may connect at a receiving slot on motherboard 14 to allow computer system 10 to access daughter card 20 via connector 22.

Typically, daughter cards 20 are computer boards that may include computer components. Examples of computer components include a network connection, a video component, a input/output component such as a graphics controller, memory 24 such as RAM, a co-processor, a power supply, storage media (e.g., hard disk drives), media drives including an optical drive or any other computer component suitable for placement on daughter card 20. In one example embodiment, daughter card 20 includes a memory riser card having memory 24 that connects to motherboard 14 to increase the amount of available computer memory for computer system 10.

Computer system 10 may access daughter card 20 via connector 22. Connector 22 is formed and sized to mate with a receiving slot on motherboard 14. Connector 22 includes a plurality of signal contacts that are used to mate with receiving slot 22a. Typically, connector 22 is formed along connector edge 27 of daughter card 20 such that connector edge 27 is placed next to motherboard to allow daughter card 20 to connect with motherboard 14. In certain embodiments, connector 22 may connect with a receiving slot on motherboard 14 if daughter card 20 is placed in guide slot 16 at the proper orientation to motherboard 14.

Guide slots 16 align daughter card 20 to a proper orientation for attaching to motherboard 14 using connector 22. Typically, first edge 23 and second edge 25 of daughter card 20 are set in opposing guide slots 16 to align daughter card 20 for placement onto motherboard 14.

Daughter card 20 may include latch 18 to prevent movement of daughter card 20 along guide slots 16. When daughter card 20 has been inserted into guide slot 16 such that a connection to motherboard 14 is made via connector 22, latch 18 may be moved to a locked position to engage guide slot 16 to hold daughter card 20 connected to motherboard 14. In some instances, latch 18 may be used to provide an additional force to hold daughter card 20 against motherboard 14.

Figure 3:
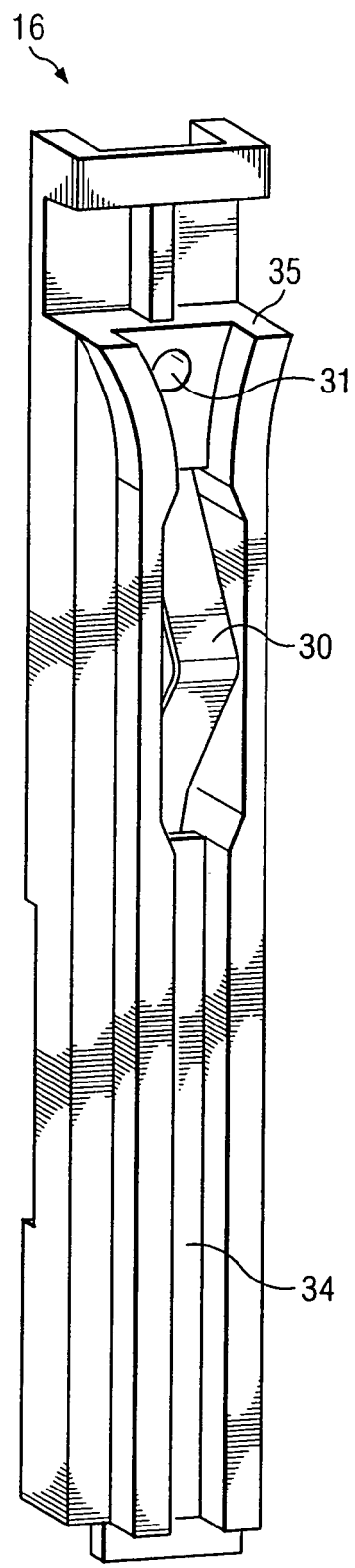
FIG. 3 illustrates a front perspective view of guide slot showing a guide tab according to an example embodiment of the present disclosure.

FIG. 3 illustrates a front perspective view of guide slot 16 showing guide tab 30. Guide slot 16 may be formed as a part of chassis 12. Alternatively, guide slot 16 may be formed as a separate component and connected to chassis 12 through screw hole 31. In some embodiments, guide slot 16 is formed from a U-shaped channel that receives first edge 23 of daughter card 20.

Typically, first edge 23 of daughter card 20 enters guide slot 16 at guide opening 35. Guide opening 35 may be larger than channel 34 to allow a user to properly set daughter card 20 in guide slot 16. As the user inserts daughter card 20 into channel 34 of guide slot 16, daughter card 20 may encounter guide tab 30.

Guide tab 30 may be coupled to guide slot 16 to interact with first detent 28 (shown below in more detail) on daughter card 20. Guide tab 30 may be formed from a flexible material such as metal or any other suitable material operable to deflect from an original position and apply pressure against daughter card 20. In one example embodiment, guide tab 30 is a stainless steel leaf spring able to apply pressure in first detent 28 to support daughter card 20 in an intermediate position.

In certain embodiments, guide tab 30 is forced behind channel 34 to allow daughter card 20 to move to along guide slot 16. As first detent 28 passes over guide tab 30, guide tab 30 may extend into first detent 28 to maintain daughter card 20 in a releaseable intermediate position, also known as a service position.

Figure 4:
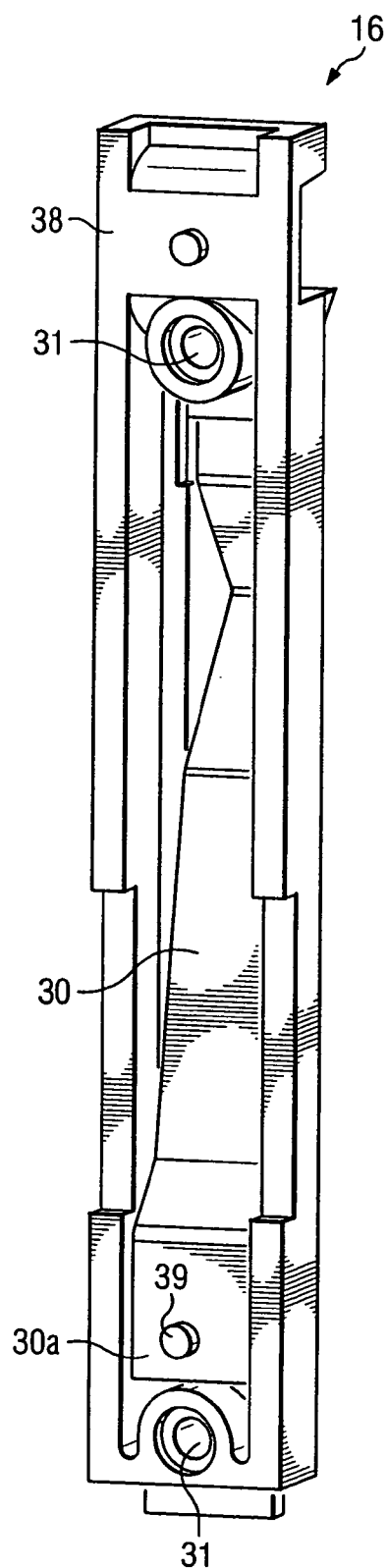
FIG. 4 illustrates a rear perspective view of guide slot including a guide tab according to an example embodiment of the present disclosure.

FIG. 4 illustrates a rear perspective view of guide slot 16 including guide tab 30. Guide slot 16 may include mounting surface 38, which may be used to connect guide slot 16 to chassis 12 via screws 31a placed in screw holes 31 to properly align daughter card 20 to motherboard 14. In some embodiments, mounting surface 38 aligns guide slot 16 substantially perpendicular to motherboard 14 to properly align daughter card 20 to connect with motherboard 14.

Guide slot 16 may be formed from a rigid material such as plastic that is able to guide daughter card 20 for connecting with motherboard 14. While guide tab 30 may be formed as a part of guide slot 16, guide tab 30 is typically constructed as a separate component and attached to guide slot 16 via tab mount 39.

Because guide tab 30 may be mounted at tab mount 39, guide tab 30 may deflect and move in relation to tab mount 39, which may allow daughter card 20 to move along guide slot 16. For example, guide tab 30 may deflect back away from daughter card 20 as daughter card 20 is inserted in guide slot 16. Thus, as guide tab 30 moves along the edge of daughter card 20 and encounters first detent 28, guide tab 30 may return to an undeflected position and extend into first detent 28.

In some embodiments, guide tab 30 is constructed from an electrically conducting material to provide a ground between chassis 12 and daughter card 20. In these instances, guide slot 16 is typically constructed from a non-conducting material, which may be used to electrically insulate guide tab 30. For example, guide tab 30 may include contact area 30a that may be placed around tab mount 39 to allow guide tab 30 to form a ground with chassis 12.

Because guide tab 30 may be used to ground daughter card 20 to chassis 12, guide tab 30 may contact ground pad 32 (shown below in more detail) on daughter card 20 when placed in an attached position. For example, when daughter card 20 is attached to motherboard 14, guide tab 30 may be placed in second detent 26 (as shown below in more detail) on daughter card 20 that includes a ground pad 32. Thus, the ground circuit would be disconnected if daughter card 20 is moved from the attached position.

Figure 5B:
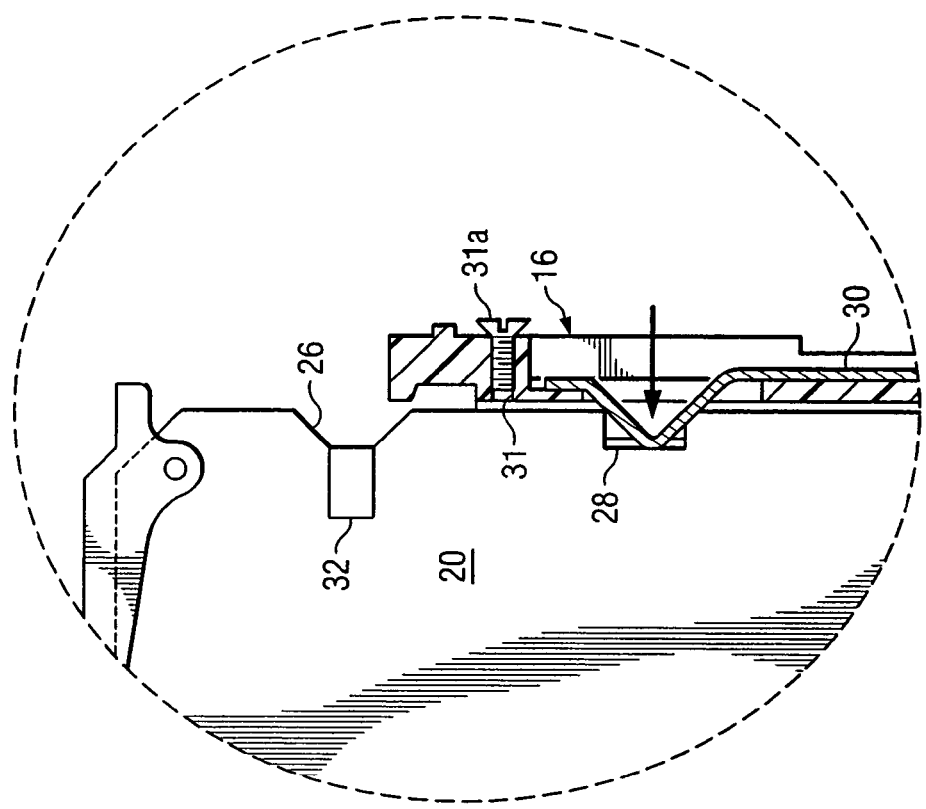

FIGS. 5A and 5B illustrate a rear view of daughter card 20 inserted between guide slots 16 in an attached position. Daughter card 20 may include connector 22 formed on connector edge 27. First edge 23 and second edge 25 may be inserted into guide slots 16, which may be used to form opposing channels to direct daughter card 20 into proper alignment for connecting with motherboard 14.

First detent 28 may be formed along either of first edge 23 or second edge 25 to interact with guide tab 30. While first detent 28 may be placed at any location along first edge 23 of daughter card 20, first detent 28 is placed to allow for clearance to remove motherboard 14 from computer system 10 without interference from daughter card 20. In one example embodiment, first detent 28 may be formed along both first edge 23 and second edge 25.

In the attached position, connector 22 on daughter card 20 may be seated onto receiving slot 22a on motherboard 14 to provide communications between computer system 10 and daughter card 20. Latch 18 on daughter card 20 may be placed in a closed position to engage a part of guide slot 16 to prevent removal of daughter card 20.

Referring to FIG. 5B, guide tab 30 is placed in a second detent 26 on daughter card 20 to interact with ground pad 32. In certain embodiments, guide tab 30 may be used to ground daughter card 20 in the attached position. In one example embodiment, second detent 26 includes an L-shaped bracket to form ground pad 32. The bracket is connected to ground for daughter card 20, which permits contacts with guide tab 30 in the attached position.

Figure 6B:
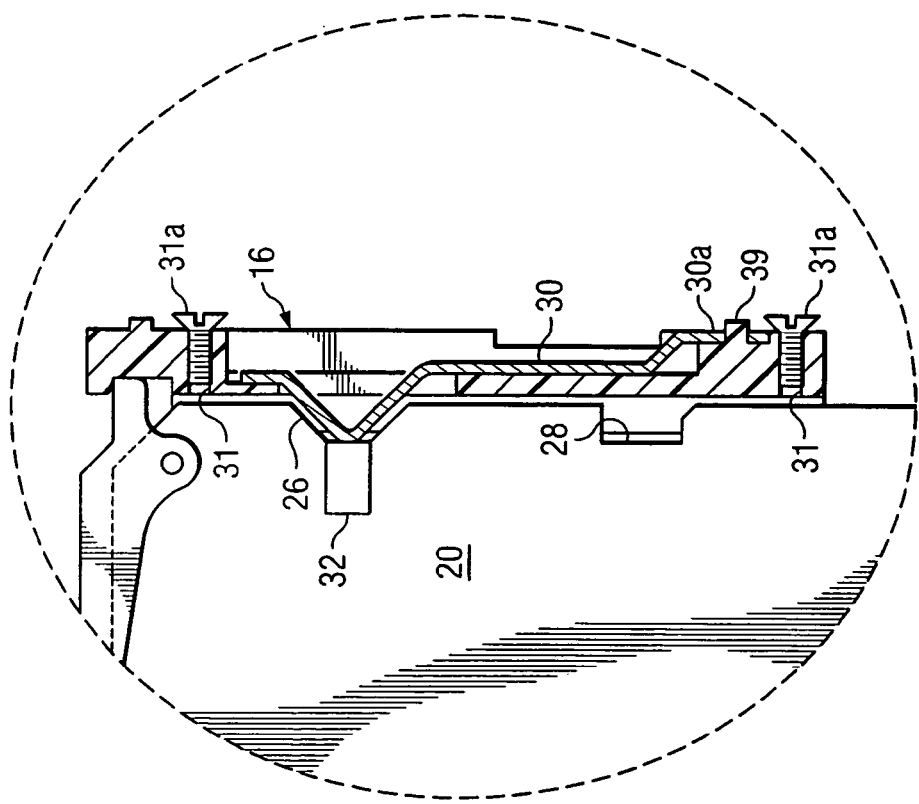

FIGS. 6A and 6B illustrate a rear view of daughter card 20 inserted between guide slots 16 at a service position. Moving daughter card 20 to a service position, or intermediate position, causes connector 22 to disconnect from motherboard 14. At the service position, daughter card 20 remains coupled to chassis 12 of computer system 10 but permits motherboard 14 to be removed from computer system 10.

Typically, a system user moves daughter card 20 from the attached position, as shown in FIGS. 5A and 5B, to a service position before removing motherboard 14. In one instance, daughter card 20 is attached to motherboard 14 at a substantially perpendicular orientation. The user may lift daughter card 20 from the attached position to disconnect connector 22 from motherboard 14. In order to disconnect daughter card 20 from motherboard, guide tab 30 may be deflected to a position that allows daughter card 20 to move along first edge 23. When guide tab 30 moves over first detent 28, guide tab 30 extends into first detent 28 to provide lateral support for daughter card 20 to prevent daughter card 20 from moving along guide slot 16.

The lateral support imparted by guide tab 30 may include a spring force of the material extending into first detent 28. In another embodiment, a frictional force between guide tab may create the lateral support 30 and first detent 28. The frictional force may be varied depending upon the coefficient of friction, the geometry of guide tab 30 and the shape of first detent 28. In one example embodiment, first detent 28 includes a rounded edge to allow a user to easily remove guide tab 30 away from a service position.

Although the present disclosure has been described with respect to a specific embodiment, various changes and modifications will be readily apparent to one skilled in the art. The present disclosure is not limited to the illustrated embodiment, but encompasses such changes and modifications that fall within the scope of the appended claims.

What is claimed is:

1. A method of accessing a printed circuit board in a computer system, comprising:

sliding a card along a guide slot in the computer system from an attached position in which the card is electrically connected to a motherboard via an electrical connector to an intermediate position in which the card is not electrically connected to the motherboard via the electrical connector, the intermediate position located between the attached position and a removed position in which the card is removed from the guide slot;

when the card reaches the intermediate position, a first detent formed along an edge of the card automatically interacting with a guide tab associated with the guide slot to support the card in the intermediate position;

wherein the guide tab and the first detent do not interact in the attached position of the card;

sliding the card from the intermediate position towards the attached position; and when the card reaches the attached position, a second detent formed along the same edge of the card as the first detent automatically interacting with the guide tab associated with the guide slot;

wherein interacting with the second detent includes forming an electrical contact between the guide tab and a ground pad.

2. The method of claim 1, wherein detachment of the card and the printed circuit board when the card is in the intermediate position is sufficient to permit access to the printed circuit board but the card remains coupled to a chassis of the computer system.

3. The method of claim 1, wherein automatically interacting the guide tab with the detent further comprises extending a portion of the guide tab into the detent to provide lateral support for the card.

4. The method of claim 3, wherein the lateral support further comprises imparting the lateral support using a spring force.

5. The method of claim 3, wherein the lateral support further comprises creating a frictional force between the guide tab and the first detent.

6. The method of claim 5, further comprising varying the frictional force depending upon a coefficient of friction.

7. The method of claim 5, further comprising varying the frictional force depending upon a geometry of the guide tab.

8. The method of claim 5, further comprising varying the frictional force depending upon a shape of the first detent.

9. The method of claim 1, wherein interacting the first detent comprises interacting a first detent comprising a notch having sidewalls substantially perpendicular to the edge.

10. The method of claim 9, wherein interacting the second detent comprises interacting a second detent comprising a notch having sidewalls angled with respect to the edge.

* * * * *